United States Patent
Johnson, III et al.

(10) Patent No.: US 9,621,047 B2
(45) Date of Patent: Apr. 11, 2017

(54) SYSTEMS AND METHODS FOR MEASURING POWER SYSTEM CURRENT USING OR-ING MOSFETS

(71) Applicant: Dell Products L.P., Round Rock, TX (US)

(72) Inventors: Ralph J. Johnson, III, Round Rock, TX (US); Shiguo Luo, Austin, TX (US); Wayne Kenneth Cook, Round Rock, TX (US); Mehran Mirjafari, Austin, TX (US); Hang Li, Austin, TX (US); Kejiu Zhang, Round Rock, TX (US); Lei Wang, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 43 days.

(21) Appl. No.: 14/512,069

(22) Filed: Oct. 10, 2014

(65) Prior Publication Data

US 2016/0105101 A1    Apr. 14, 2016

(51) Int. Cl.
| | | |
|---|---|---|
| G05F 1/56 | (2006.01) | |
| H02M 3/28 | (2006.01) | |
| H02M 1/00 | (2006.01) | |

(52) U.S. Cl.
CPC ...... H02M 3/285 (2013.01); *H02M 2001/007* (2013.01); *H02M 2001/0009* (2013.01)

(58) Field of Classification Search
CPC ................................................ H02M 2001/007
USPC ......................................... 323/281–285, 351
See application file for complete search history.

(56) References Cited

U.S. PATENT DOCUMENTS

| | | | | |
|---|---|---|---|---|
| 7,092,260 B2 * | 8/2006 | Berghegger | ...... | H02M 3/33592 363/21.06 |
| 7,183,756 B1 * | 2/2007 | Dikken | ................... | G05F 3/262 323/280 |
| 7,391,630 B2 * | 6/2008 | Acatrinei | .................. | G05F 1/70 363/89 |
| 7,660,133 B1 * | 2/2010 | Hwang | ............. | H02M 3/33592 363/16 |
| 7,719,293 B2 * | 5/2010 | Farkas | ............... | G01R 19/0092 324/713 |
| 7,800,354 B2 * | 9/2010 | Kanouda | ............. | H02M 1/4225 323/284 |
| 2005/0225307 A1 * | 10/2005 | Sato | ..................... | H02M 3/1584 323/282 |
| 2008/0001553 A1 * | 1/2008 | Qiu | ...................... | H02M 3/1588 315/307 |
| 2008/0157736 A1 * | 7/2008 | Zafarana | ............... | H02M 3/156 323/282 |
| 2012/0230060 A1 * | 9/2012 | Tanaka | ................. | H02M 1/4258 363/16 |

(Continued)

*Primary Examiner* — Adolf Berhane
*Assistant Examiner* — Nusrat Quddus
(74) *Attorney, Agent, or Firm* — Jackson Walker L.L.P.

(57) ABSTRACT

In accordance with embodiments of the present disclosure, a power supply unit may include one or more stages including an output stage configured to generate a direct-current output voltage at an output of the power supply, an OR-ing metal-oxide-semiconductor field effect transistor (MOSFET) coupled between the output stage and the output, and a controller. The controller may be configured to measure a signal indicative of a voltage associated with the OR-ing MOSFET and determine an estimated output current of the power supply based on the signal.

20 Claims, 2 Drawing Sheets

(56) References Cited

U.S. PATENT DOCUMENTS

| | | | | |
|---|---|---|---|---|
| 2012/0230076 A1* | 9/2012 | Palmer | ............... | H03K 17/0828 363/132 |
| 2013/0265029 A1* | 10/2013 | Akiyama | ............... | H03K 17/94 323/311 |
| 2014/0012423 A1* | 1/2014 | Li | ..................... | F24F 11/006 700/276 |
| 2014/0241018 A1* | 8/2014 | Hwang | ............... | H02M 3/3376 363/53 |
| 2014/0334193 A1* | 11/2014 | Meyer | ............... | H02M 3/33584 363/21.01 |
| 2015/0137782 A1* | 5/2015 | Wang | ................. | G01R 19/0092 323/282 |

* cited by examiner

SYSTEMS AND METHODS FOR MEASURING POWER SYSTEM CURRENT USING OR-ING MOSFETS

TECHNICAL FIELD

The present disclosure relates in general to information handling systems, and more particularly to sensing a current associated with a power system in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include a power supply in order to convert power (e.g., provided by a public utility) to a desired voltage level and/or current level to power components of the information handling system. Oftentimes, it is desirable to collect telemetry data regarding the power supply, such as an amount of current being delivered by a power supply to components of an information handling system. For example, such monitoring of power supply output current may be used to inform a controller of an information handling system for implementing a power sharing scheme among power supply units, power supply redundancy schemes, over-current warnings, power throttling, and/or other uses.

A popular existing approach to measure output current is the use of bulky resistor shunts, which may be placed proximate to OR-ing metal-oxide-semiconductor-field-effect-transistors (MOSFETs) at the output of a power system. A voltage across such resistor shunts may be measured, and by knowing the resistance of such resistor shunts, the current may be determined from the voltage based on Ohm's law. Such shunts may undesirably consume power, are bulky and may take a significant amount of area, cause significant heat output, and may also add financial cost to the manufacturing of an information handling system.

SUMMARY

In accordance with the teachings of the present disclosure, the disadvantages and problems associated with current sensing in a power supply may be reduced or eliminated.

In accordance with embodiments of the present disclosure, a power supply unit may include one or more stages including an output stage configured to generate a direct-current output voltage at an output of the power supply, an OR-ing metal-oxide-semiconductor field effect transistor (MOSFET) coupled between the output stage and the output, and a controller. The controller may be configured to measure a signal indicative of a voltage associated with the OR-ing MOSFET and determine an estimated output current of the power supply based on the signal.

In accordance with these and other embodiments of the present disclosure, a method may include measuring a signal indicative of a voltage associated with an OR-ing metal-oxide-semiconductor field effect transistor (MOSFET) coupled between an output of a power supply and an output stage configured to generate a direct-current output voltage at the output and determining an estimated output current of the power supply based on the signal.

In accordance with these and other embodiments of the present disclosure, an information handling system may include a power supply unit and at least one information handling resource electrically coupled to the power supply unit. The power supply unit may include one or more stages including an output stage configured to generate a direct-current output voltage at an output of the power supply, an OR-ing metal-oxide-semiconductor field effect transistor (MOFET) coupled between the output stage and the output, and a controller. The controller may be configured to measure a signal indicative of a voltage associated with the OR-ing MOSFET and determine an estimated output current of the power supply based on the signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal data assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, power supplies, air movers (e.g., fans and blowers) and/or any other components and/or elements of an information handling system.

Figure 1:
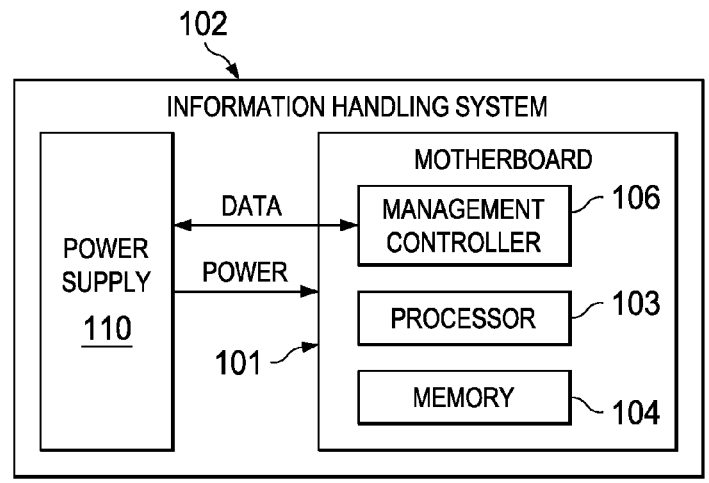
FIG. 1 illustrates a block diagram of an example information handling system, in accordance with embodiments of the present disclosure.

FIG. 1 illustrates a block diagram of an example of an information handling system 102 incorporating a power supply 110 in accordance with an embodiment of the present disclosure. As depicted, information handling system 102 may include power supply 110, a motherboard 101, and one or more other information handling resources.

Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include a processor 103, memory 104, a management controller 106, and one or more other information handling resources.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102. Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Management controller 106 may be configured to provide out-of-band management facilities for management of information handling system 102. Such management may be made by management controller 106 even if information handling system 102 is powered off or powered to a standby state. Management controller 106 may include a processor, memory, out-of-band network interface separate from and physically isolated from an in-band network interface of information handling system 102, and/or other embedded information handling resources. In certain embodiments, management controller 106 may include or may be an integral part of a baseboard management controller (BMC) or a remote access controller (e.g., a Dell Remote Access Controller of Integrated Dell Remote Access Controller). In other embodiments, management controller 106 may include or may be an integral part of a chassis management controller (CMC). In some embodiments, management controller 106 may be configured to communicate with power supply 110 to communicate control and/or telemetry data between the two.

Generally speaking, power supply 110 may include any system, device, or apparatus configured to supply electrical current to one or more information handling resources of information handling system 102. An example of power supply 110 is set forth in FIG. 2.

Figure 2:
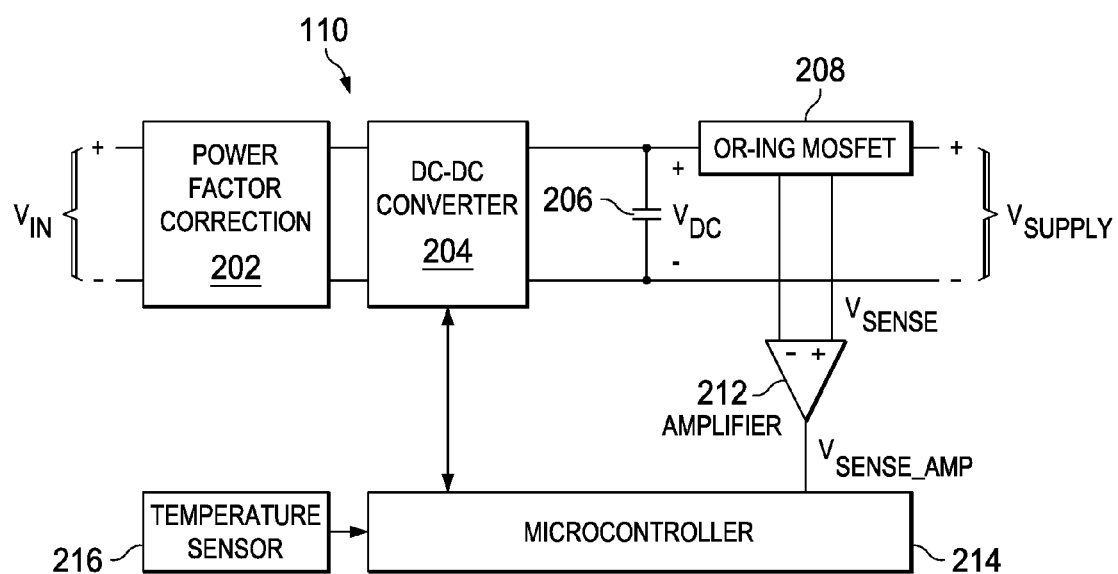
FIG. 2 illustrates a block diagram of an example power supply for use in the information handling system depicted in FIG. 1, in accordance with embodiments of the present disclosure.

FIG. 2 illustrates a block diagram of an example power supply 110 for use in information handling system 102 depicted in FIG. 1, in accordance with embodiments of the present disclosure. As shown in FIG. 2, power supply 110 may comprise a power-factor correction block 202, a direct-current-to-direct-current (DC-DC) converter 204, a bulk capacitor 206, an OR-ing MOSFET 208, an amplifier 212, a microcontroller 214, and a temperature sensor 216.

Power factor correction block 202 may comprise any system, device, or apparatus configured to receive an alternating current (AC) power source with voltage $V_{IN}$ and increase the ratio of the real power (e.g., non-reactive power) to the apparent power (e.g., reactive power plus non-reactive power) delivered from the power source as compared to if power factor correction block 202 were not present. Power factor correction block 202 may be implemented in any suitable manner now or in the future known to provide power factor correction.

DC-DC converter 204 may be coupled to the output of power factor correction block 202 and may comprise any suitable electronic or electric system, device, or apparatus is an electronic circuit which converts a source of direct current (DC) (e.g., a DC current generated by power factor correction block 202) from one voltage level to another voltage level with voltage $V_{DC}$. Examples of such a DC-DC converter 204 may be a boost converter, buck converter, buck-boost converter, Ćuk-type converter, or any other suitable type of converter. In some embodiments, voltage $V_{DC}$ may be equal to approximately 12 volts.

Bulk capacitor 206 may include any passive two-terminal electrical component configured to store energy electrostatically in an electric field. As shown in FIG. 2, bulk capacitor 206 may be coupled between output terminals of DC-DC converter 204 and may thus be operable to hold voltage $V_{DC}$ at a stable level.

The combination of power factor correction block 202, DC-DC converter 204 and bulk capacitor 206 may serve to convert an AC voltage source $V_{IN}$ into a DC voltage supply $V_{DC}$. However, in embodiments in which a DC voltage source is to be converted into another DC voltage, power factor correction block 202 may not be present, and DC-DC converter 204 may directly convert the DC source voltage into a DC voltage supply $V_{DC}$.

OR-ing MOSFET 208 may be coupled via its source terminal to a positive polarity output terminal of DC-DC converter 204 and via its drain terminal to a positive polarity output of power supply 110. OR-ing MOSFET 208 may comprise any suitable MOSFET, including a typical n-type MOSFET or a current-sensing n-type power MOSFET, having a diode coupled between its source and drain terminals. Example implementations for OR-ing MOSFET 208 are set forth in FIGS. 3 and 4 described below. In operation, OR-ing MOSFET 208 may protect against reverse current flow should one power supply 110 or another power supply of information handling system 102 develop a catastrophic output short to ground or should a voltage of an individual power supply in information handling system 102 fall significantly below the others. Although only one OR-ing MOSFET 208 is depicted in FIG. 2 for the purposes of clarity and exposition, in some embodiments, power supply 110 may comprise a plurality of OR-ing MOSFETs 208 coupled in parallel at their respective source and drain terminals. Due to the presence of OR-ing MOSFET 208, power supply 110 may generate an output supply voltage $V_{SUPPLY}$ which may be slightly different from but substantially equal to voltage $V_{DC}$. Power supply 110 may communicate output supply voltage $V_{SUPPLY}$ to motherboard 101 and/or other information handling resources of information handling system 102.

Amplifier 212 may comprise any system, device, or apparatus for increasing power of a signal, for example by taking energy from a power supply and controlling the output of the amplifier to match the input signal shape but with a larger amplitude. Example implementations for amplifier 212 are set forth in FIGS. 3 and 4 described below.

Microcontroller 214 may comprise any suitable system, device, or apparatus for processing an amplified voltage signal $V_{SENSE\_AMP}$ associated with OR-ing MOSFET 208 and determining a current delivered by power supply 110 based on such amplified voltage signal $V_{SENSE\_AMP}$. In some embodiments, microcontroller 214 may include an analog-to-digital converter for converting analog voltage $V_{SENSE\_AMP}$ into a corresponding digital signal that may be processed by digital circuitry of microcontroller 214 (e.g., a digital signal processor, application-specific integrated circuit, microprocessor, or other controller).

Temperature sensor 216 may comprise any system, device, or apparatus (e.g., a thermometer, thermistor, diode, etc.) configured to communicate a signal to microcontroller 214 and/or control logic internal to the microcontroller 214 indicative of a temperature proximate to OR-ing MOSFET 208. In some embodiments, temperature sensor 216 may comprise a negative temperature coefficient resistor which is typically present in power supplies provided by many vendors to measure temperature.

Figure 3:
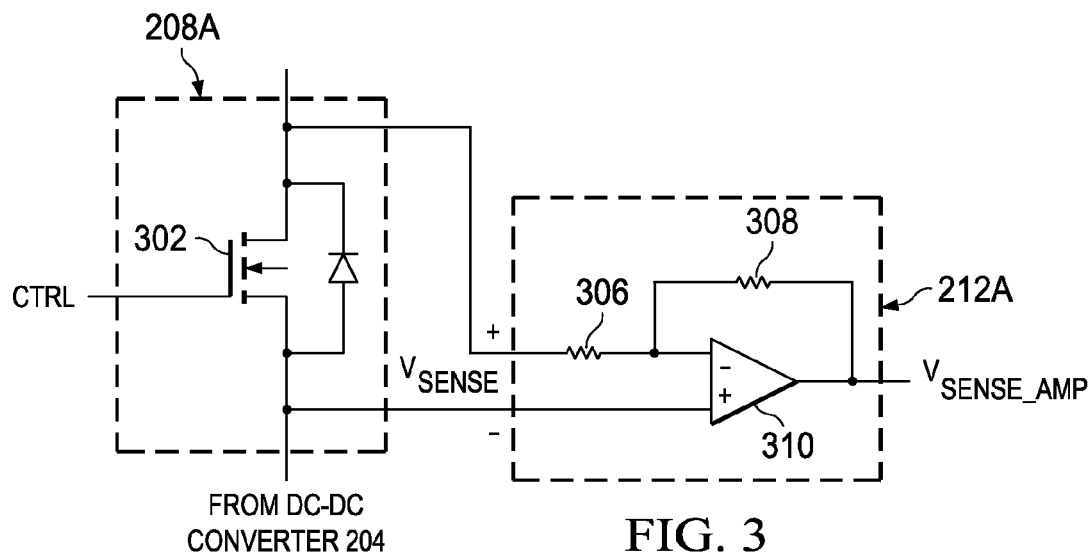
FIG. 3 illustrates a circuit diagram of an example OR-ing MOSFET and example amplifier for use in the example power supply of FIG. 2, in accordance with embodiments of the present disclosure.

FIG. 3 illustrates a circuit diagram of an example OR-ing MOSFET 208A and example amplifier 212A for use as OR-ing MOSFET 208 and amplifier 212, respectively, of example power supply 110 of FIG. 2, in accordance with embodiments of the present disclosure. As shown in FIG. 3, OR-ing MOSFET 208A may comprise a typical n-type MOSFET. A control signal CTRL may be applied to a gate terminal of MOSFET 302 in order to control its operation, as is known in the art. The voltage $V_{SENSE}$ received by amplifier 212A may be the voltage difference between the drain terminal and the source terminal of MOSFET 302 (e.g., the drain-source voltage of MOSFET 302). In the embodiments represented by FIG. 3, such voltage $V_{SENSE}$ may be amplified by a traditional inverting amplifier comprising an operational amplifier 310 and gain resistors 306 and 308.

Figure 4:
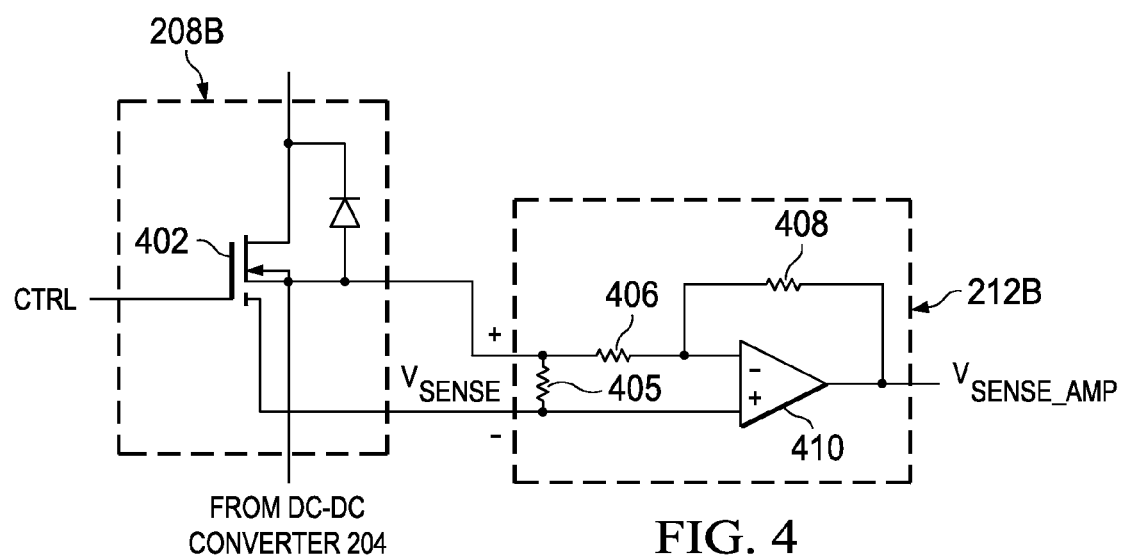
FIG. 4 illustrates a circuit diagram of another example OR-ing MOSFET and example amplifier for use in the example power supply of FIG. 2, in accordance with embodiments of the present disclosure.

FIG. 4 illustrates a circuit diagram of an example OR-ing MOSFET 208B and example amplifier 212B for use as OR-ing MOSFET 208 and amplifier 212, respectively, of example power supply 110 of FIG. 2, in accordance with embodiments of the present disclosure. As shown in FIG. 4, OR-ing MOSFET 208B may comprise a current-sensing n-type power MOSFET 402. A control signal CTRL may be applied to a gate terminal of MOSFET 402 in order to control its operation, as is known in the art. MOSFET 402 may comprise any suitable MOSFET having an additional terminal, often referred to as a "sense" terminal, for measuring a current associated with MOSFET 402. In some embodiments, MOSFET 402 may comprise a SENSEFET®. For OR-ing 208B, the voltage $V_{SENSE}$ amplified by amplifier 212B may be the voltage difference between the source terminal and the sense terminal of MOSFET 402 that may develop across sense resistor 405 of amplifier 212B as a result of the current flowing from the sense terminal of MOSFET 202. In the embodiments represented by FIG. 4, such voltage $V_{SENSE}$ may be amplified by a traditional inverting amplifier comprising an operational amplifier 410 and gain resistors 406 and 408.

To account for temperature, process, or other variations of parameters of OR-ing MOSFET 208 (e.g., a drain-to-source resistance of MOSFET 208), calibration and temperature compensation may be undertaken by components of power supply 110. For the embodiments of power supply 110 which include the OR-ing MOSFET 208A of FIG. 3, calibration may be made part of a factory/production line test plan and performed by automatic test equipment. For example, automatic test equipment may use its own sensors to measure the level of current being supplied by power supply 110 and compare that with the reading from microcontroller 214 to determine an accurate value of the drain-to-source resistance of OR-ing MOSFET 208A for a given temperature (e.g., 25° C.). With this base value for the drain-to-source resistance derived for a particular temperature, microcontroller 214 may utilize temperature readings from temperature sensor 216 as the temperature of OR-ing MOSFET 208A. In some embodiments, a difference in temperature between temperature sensor 216 and the junction temperature of MOFET 208A may also be considered. From the measured temperature of OR-ing MOSFET 208A, microcontroller 214 may calculate the drain-to-source resistance based on known resistance versus junction temperature characteristics of OR-ing MOSFET 208A. In some embodiments, such resistance versus junction temperature characteristics may be linearized section-by-section and stored into a computer-readable medium of or accessible to microcontroller 214.

Alternatively, for the embodiments of power supply 110 which include the OR-ing MOSFET 208A of FIG. 3, microcontroller 214 may leverage a current transformer (not shown) of DC-DC converter 204 that may be used to provide current limiting protection within DC-DC converter 204. A measurement of the current of such current transformer may be received by microcontroller 214 and compared to the current for OR-ing MOSFET 208A sensed by microcontroller 214. Based on turns ratio and other properties of DC-to-DC converter 206, the current for OR-ing MOSFET 208A sensed by microcontroller 214 may be a function of the current transformer within DC-DC converter 204 for stable output loads (e.g., without large transients). Accordingly, calibration may be performed at start up or initialization of power supply 110, wherein management controller 106 may cause processor 103, memory 104, and/or one or more other information handling resources of information handling system 102 to run at a particular steady-state load such that the load to power supply 110 remains substantially constant. By comparing a measured current of a current transformer of DC-DC converter 204 to the reported measured current of OR-ing MOSFET 208A, microcontroller 214 may determine an accurate value of the drain-to-source resistance of OR-ing MOSFET 208A for a given temperature (e.g., 25° C.). With this base value for the drain-to-source resistance derived for a particular temperature, microcontroller 214 may utilize temperature readings from temperature sensor 216 as the temperature of OR-ing MOSFET 208A. In some embodiments, a difference in temperature between temperature sensor 216 and the junction temperature of MOFET 208A may also be considered. From the measured temperature of OR-ing MOSFET 208A, microcontroller 214 may calculate the drain-to-source resistance based on known resistance versus junction temperature characteristics of OR-ing MOSFET 208A. In some embodiments, such resistance versus junction temperature characteristics may be linearized section-by-section and stored into a computer-readable medium of or accessible to microcontroller 214.

For embodiments employing OR-ing MOSFET 208B, a separate calibration step may not be needed because the current output of the sense terminal may be proportional to the current of the main channel, with such ratio being fixed in production. Nonetheless, temperature compensation may still be needed, and may be performed in a manner similar to that discussed above with respect to temperature compensation of OR-ing MOSFET 208A.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A power supply unit comprising:
   an output stage configured to generate a direct-current output voltage;
   a power supply output;
   an OR-ing stage comprising:
      a metal-oxide-semiconductor field effect transistor (MOSFET), including a source terminal connected to the output stage and a drain terminal connected to the power supply output, for preventing a reverse current flow from the output to the output stage; and
      a diode including an anode cathode connected to the drain terminal and an anode connected to a MOSFET terminal selected from: the source terminal and a sense terminal;
   a controller configured to:
      measure a signal indicative of a voltage associated with the OR-ing MOSFET; and
      determine an estimated output current of the power supply based on the signal.

2. The power supply unit of claim 1, wherein the signal is indicative of a drain-to-source voltage of the MOSFET.

3. The power supply unit of claim 1, wherein the MOSFET comprises a current-sensing power MOSFET and the signal is indicative of a current associated with a sense terminal of the current-sensing power MOSFET.

4. The power supply unit of claim 1, wherein the MOSFET comprises an n-type MOSFET.

5. The power supply unit of claim 1, wherein the controller is further configured to calibrate a drain-to-source resistance of the MOSFET.

6. The power supply of claim 5, wherein the controller is configured to calibrate the drain-to-source resistance of the MOSFET by comparing a current measurement measured by automatic test equipment coupled to the output to the estimated output current of the power supply based on the signal.

7. The power supply of claim 5, wherein the controller is configured to calibrate the drain-to-source resistance of the MOSFET by comparing a current measurement associated with a current transformer of the one or more stages to the estimated output current of the power supply based on the signal.

8. The power supply of claim 1, wherein the controller is configured to perform compensation to account for temperature variation of a drain-to-source resistance of the MOSFET based on an temperature associated with the MOSFET.

9. The power supply of claim 8, wherein the ambient temperature is sensed by a negative temperature coefficient resistor of the power supply.

10. A method comprising:
   generating, in a power supply, a sense signal indicative of a voltage associated with a metal-oxide-semiconductor field effect transistor (MOSFET) of a sensing stage coupled between a power supply output and an output stage configured to generate a direct-current output voltage, wherein a source terminal of the MOSFET is connected to the output stage and a drain terminal of the MOSFET is connected to the power supply output;

amplifying the sense signal with an operational amplifier circuit to produce an amplified signal; and determining an estimated output current of the power supply based on the amplified signal.

11. The method of claim 10, wherein the sense signal is indicative of a drain-to-source voltage of the MOSFET.

12. The method of claim 10, wherein the MOSFET comprises a current-sensing power MOSFET and the sense signal is indicative of a current associated with a sense terminal of the current-sensing power MOSFET.

13. The method of claim 10, wherein the MOSFET comprises an n-type MOSFET and wherein a cathode of a diode is connected to the drain terminal and an anode of the diode is connected to a MOSFET terminal selected from the source terminal and a sense terminal.

14. The method of claim 10, further comprising calibrating a drain-to-source resistance of the MOSFET.

15. The method of claim 14, wherein calibrating the drain-to-source resistance comprises comparing a current measurement measured by automatic test equipment coupled to the power supply output to the estimated output current of the power supply based on the amplified signal.

16. The method of claim 14, wherein calibrating the drain-to-source resistance comprises comparing a current measurement associated with a current transformer of the power supply to the estimated output current of the power supply based on the amplified signal.

17. The method of claim 10, further comprising performing compensation to account for temperature variation of a drain-to-source resistance of the MOSFET based on an temperature associated with the MOSFET.

18. The method of claim 17, wherein the ambient temperature is sensed by a negative temperature coefficient resistor of the power supply.

19. An information handling system comprising:
  a power supply unit comprising:
    an output stage configured to generate a direct-current output voltage;
    a power supply output;
    an OR-ing metal-oxide-semiconductor field effect transistor (MOSFET) including a source terminal connected to the output stage and a drain terminal connected to the power supply output for preventing a reverse current flow from the output to the output stage;
    an operational amplifier configured to:
      receive a sense signal indicative of a voltage associated with the OR-ing MOSFET; and
      produce an amplified signal in accordance with the sense signal; and
    a controller configured to:
      receive the amplified signal; and
      determine an estimated output current of the power supply based on the amplified signal; and
  at least one information handling resource electrically coupled to the power supply unit.

20. The power supply unit of claim 19, wherein the sense signal is indicative of one of:
  a drain-to-source voltage of the MOSFET; and
  a current associated with a sense terminal of a current-sensing power MOSFET integral to the MOSFET.

\* \* \* \* \*